United States Patent [19]

Bremer

[11] Patent Number: 5,282,112
[45] Date of Patent: Jan. 25, 1994

[54] BACKPLANE HAVING A JUMPER PLUG TO CONNECT SOCKET CONNECTIONS TO A BUS LINE

[75] Inventor: Klaus Bremer, Erlangen, Fed. Rep. of Germany

[73] Assignee: Siemens Aktiengesellschaft, Munich, Fed. Rep. of Germany

[21] Appl. No.: 976,723

[22] Filed: Nov. 16, 1992

Related U.S. Application Data

[63] Continuation of Ser. No. 909,132, Jul. 6, 1992, abandoned, which is a continuation of Ser. No. 737,564, Jul. 26, 1991, abandoned, which is a continuation of Ser. No. 610,299, Nov. 6, 1990, abandoned, which is a continuation of Ser. No. 494,947, Mar. 14, 1990, abandoned, which is a continuation of Ser. No. 170,766, Mar. 21, 1988, abandoned.

[30] Foreign Application Priority Data

Mar. 20, 1987 [DE] Fed. Rep. of Germany ....... 3709115

[51] Int. Cl.$^5$ ............................................. H01G 5/06
[52] U.S. Cl. ................................. 361/729; 439/510; 361/633; 361/775; 361/788
[58] Field of Search ............... 361/352, 393, 396, 400, 361/406–407, 413, 415; 439/510

[56] References Cited

U.S. PATENT DOCUMENTS

| | | | |
|---|---|---|---|
| 3,891,898 | 6/1975 | Damon | 361/406 |
| 3,923,359 | 12/1975 | Newsam | 339/17 M |
| 4,195,896 | 4/1980 | Wagner et al. | 361/352 |
| 4,283,100 | 8/1981 | Griffin et al. | 439/510 |
| 4,391,482 | 7/1983 | Czeschka | 339/59 M |
| 4,516,817 | 5/1985 | Deterr | 439/510 |
| 4,654,820 | 3/1987 | Brahm et al. | 361/393 |
| 4,674,812 | 6/1987 | Thom et al. | 439/78 |

FOREIGN PATENT DOCUMENTS

| | | |
|---|---|---|
| 0004899 | 10/1979 | European Pat. Off. . |
| 0195955 | 1/1986 | European Pat. Off. . |
| 2233578 | 1/1973 | Fed. Rep. of Germany . |
| 8410261 | 5/1985 | Fed. Rep. of Germany . |
| 2525065 | 10/1983 | France . |

OTHER PUBLICATIONS

"Backplanes Play a Crucial Role in High-Speed System", EDN, Jul. 10, 1986.
Multibus II Product Directory, second half 1986.

Primary Examiner—Gregory D. Thompson
Attorney, Agent, or Firm—Kenyon & Kenyon

[57] ABSTRACT

A backplane comprises several socket connectors that are arranged in parallel, side by side on a side that faces the modules. The socket connector has pins which form a pin field that face away from the modules. At least one bus comprises at least one bus line. A bus contact pin of each socket connector of the bus has an associated contact pin. These contact pins are electrically connected to each other with a bus line. Each contact pin can be electrically connected with a jumper plug to its associated bus contact pin. A backplane comprising a bus that extends beyond the modules is thus obtained where modules can be separated from the bus without having to pull the modules from their plug-in locations on a module carrier.

4 Claims, 1 Drawing Sheet

BACKPLANE HAVING A JUMPER PLUG TO CONNECT SOCKET CONNECTIONS TO A BUS LINE

This is a continuation of application Ser. No. 07/909,132, filed Jul. 6, 1992, now abandoned, which is a continuation of application Ser. No. 07/737,564, filed Jul. 26, 1991, now abandoned, which is a continuation of application Ser. No. 07/610,299, filed Nov. 6, 1990, now abandoned, which is a continuation of application Ser. No. 07/494,947, filed Mar. 14, 1990, now abandoned, which is a continuation of application Ser. No. 07/170,766, filed Mar. 21, 1988, now abandoned.

RELATED APPLICATIONS

Of interest to the present application are copending applications titled "Backplane With Associated Handling Means", Ser. No. 170,146 "Backplane Having a Movable Contact Means", Ser. No. 170,147, and "Backplane", Ser. No. 170,145 all of which have the same assignee and filing date as the present application.

BACKGROUND OF THE INVENTION

1. Field of the Invention

The present invention relates to a backplane that has several socket connectors arranged in parallel, side by side on a side of the backplane that faces the module. The socket connectors have pins on a side that faces away from the module and form a pin field. At least one bus consists of at least one bus line.

2. Description of Related Art

Backplanes are commercially available and are known, for instance, as VME bus boards. The VME bus is a standardized bus which is responsible for fast data traffic between the most important components of a bus system. The bus structure forms the connecting bars between the building blocks and modules of a micro or minicomputer system. The bus structures also varies according to the system components used and the desired performance. The structure influences the performance of the overall system because the entire data exchange takes place via such bus systems. The data exchange takes place, for instance, in a 8-, 16- or 32-bit format. For example, 8, 16 or 32 bus line systems interconnect the individual modules of a bus system. A fault caused by a short circuit of an output driver with the supply voltage of a bus participant can block the entire bus system. A diagnostic routine can localize the defective bus participant for many types of faults. However, some types of faults can be determined only by sequentially separating all bus participants from the bus until the defective participant is found and the trouble corrected. The entire function of the participant concerned is put out of operation when the individual bus participants are pulled out of their plug-in locations in a module carrier. This fault isolation process leads to down time.

SUMMARY OF THE INVENTION

It is an object of the invention to develop an improved backplane that enables at least one module to be separated from a bus having several modules without having to pull out the module from its place in a module carrier.

In the present invention a bus contact pin of each socket connector of a bus is associated with a contact pin. The contact pins are electrically connected to each other with a bus line. Each contact pin is connected to its associated bus contact pin with a jumper plug.

In contrast to known backplanes, the bus lines of a bus of the present invention do not interconnect the bus contact pins of several socket connectors. Rather, the bus interconnects the associated contact pins that are parallel to the bus contact pins. Contact between the respective bus contact pins of a socket connector and the corresponding contact pins is made with a jumper plug that is plugged into the corresponding contacts. This design of the backplane permits separating a defective bus participant module from the bus without having to pull this bus participant module from its plug-in location of a module carrier. Any desired bus participant module thus can be separated from a bus that extends beyond the modules so that it no longer blocks the latter without having to take the additional functions of the module out of operation.

In one embodiment of the present invention the backplane comprises at least two buses. The buses can comprise several bus lines. The bus contact pins of each socket connector of a bus can be connected to the corresponding contact with multi-pole jumper plugs.

One of the two buses can be redundant if at least two buses on the backplane each comprise several bus lines. The bus participant modules can be connected to both buses with multiple jumpers. The modules can then be electrically separated from the bus without having to take the module out of operation. Fault localization on one of the two buses is thus achieved without taking the system off line.

DETAILED DESCRIPTION

Figure 1:
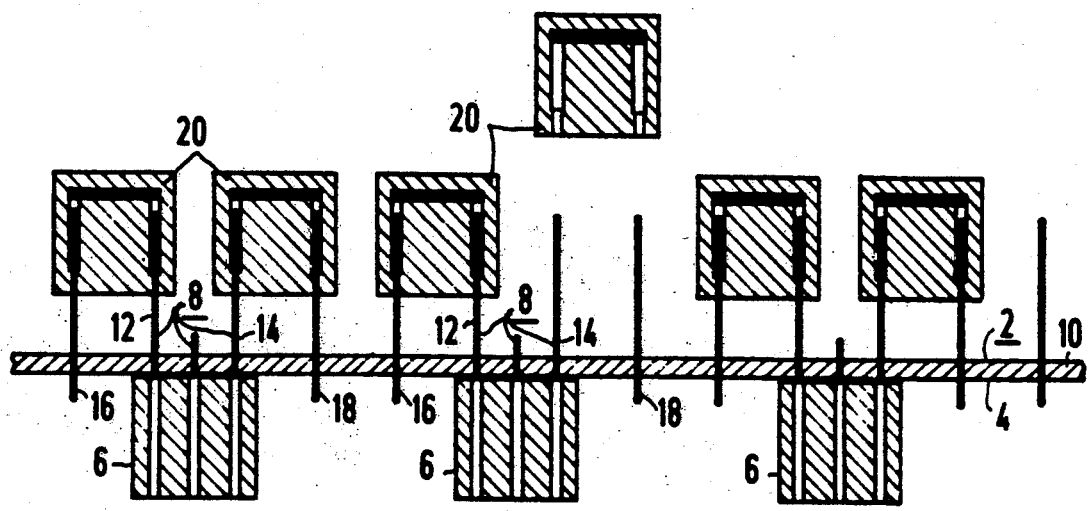
FIG. 1 shows a longitudinal cross section through a backplane having two buses.

FIG. 1 shows a section through a backplane 2. Several socket connectors 6 are provided on the side 4 that faces the modules. The pins 8 of the socket connectors 6 form a pin field on the side 10 that faces away from the modules. Each bus contact pin 12 or 14, respectively, of each socket connector 6 of a bus has a corresponding contact pin 16 or 18. The corresponding contact pins 16 and 18 are electrically connected with respective jumper plugs 20 by corresponding bus contact pins 12, 14.

Figure 2:
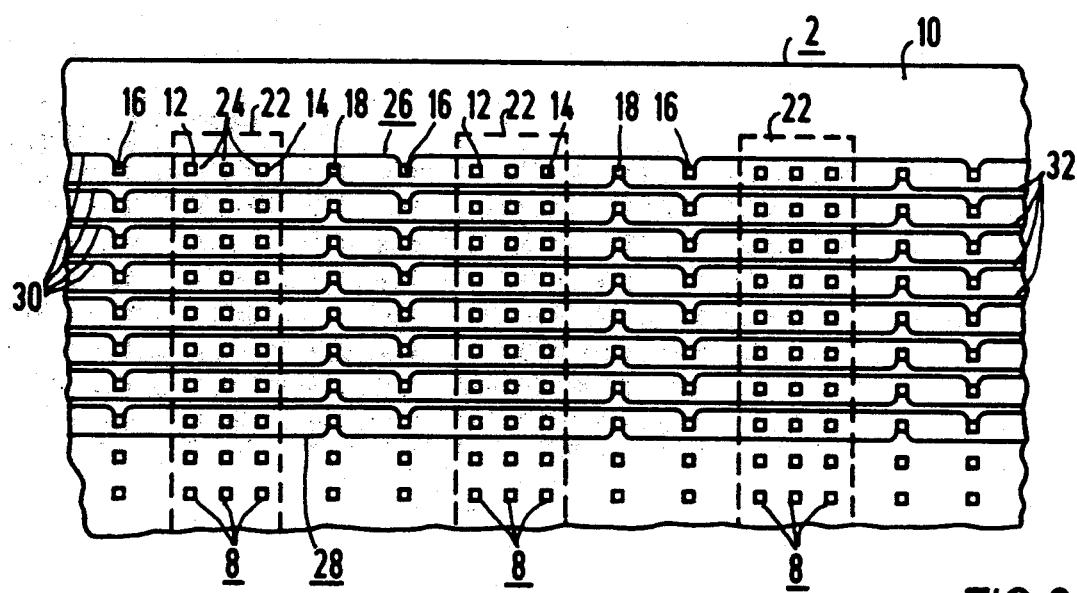
FIG. 2 shows a top view on the side of the backplane that faces away from the modules, without jumper plugs.

FIG. 2 shows a top view on the side 10 of the backplane 2 that faces away from the modules. Jumpers 20 have been omitted for clarity. The socket connectors 6 that are arranged on the side 4 that face the modules are shown on side 10 facing away from the modules with dashed line 22. Socket connectors 6 are 96-pole socket connectors. The contact pins 8 of each socket connector 6 are arranged in three rows of contacts 24. In addition, two buses 26 and 28 are provided which each have eight bus lines 30 and 32, respectively. Bus 28 is redundant with bus 26. The bus contact pins 12 of each socket connector 6 of the bus 26 belong to the respective contact pins of an outer row of each socket connector 6. A contact pin 16 is associated with each of these bus contact pins 12. The eight contact pins 16 are associated with respective socket connectors 6 and electrically connected to each other with the eight bus lines 30 of the first bus 26. The individual bus participant modules are electrically connected to the first bus 26 by a multi-pole jumper plug 20, shown here as an 8-pole jumper. The bus contact pins 14 of each socket connector 6 are likewise electrically connected by 8-pole jumpers 20 to the corresponding contact pins 18. The eight contact pins 18 are electrically connected to each other with the eight bus lines 32.

In operation, all bus participant modules of the backplane 2 are connected to bus 26 and redundant bus 28 by the multi-pole jumpers 20. The data transfer between the individual bus-participant modules occurs, for example, on the first bus 26. One can switch to the redundant bus 28 if a fault occurs on first bus 26. The system thus remains in operation. The fault localization procedure now takes place on the disturbed bus by sequentially separating the modules from the bus 26, i.e., the jumpers 20 which connect the modules to the first bus 26 are sequentially pulled off. A suitable test routine can determine at which module the blocking of the bus 26 is eliminated. The localized defective bus participant can then be replaced. A defective module can thus be separated from a bus with the jumpers 20 which electrically connect the bus contact pins 12, 14 of each socket connector 6 to the contact pins 16, 18 of the bus lines 30 and 32 without having to pull these modules from their plug-in location of a module carrier. The availability of a system is thus increased.

What is claimed is:

1. A backplane for a subrack having at least one module, comprising:
   a) at least one socket connector for plugging in the at least one module, arranged on a first side of the backplane and having contact means extending to a second side of the backplane, the second side facing away from the first side of the backplane, the socket connector and the corresponding module;
   b) at least two redundant busses having bus lines arranged on the second side of the backplane;
   c) at least one first multiple pole jumper plug on the second side of the backplane, being arranged to controllably electrically connect at least a preselected one of the contact means of the at least one socket connector extending to the second side of the backplane to the lines of the first bus, so that the module is electrically disconnected from the lines of the first bus upon removal of the first multiple pole jumper plug; and
   d) at least one second multiple pole jumper plug on the second side of the backplane, being arranged to controllably electrically connect at least a preselected one of the contact means of the at least one socket connector extending to the second side of the backplane to the lines of the second bus, so that the module is electrically disconnected from the lines of the second bus upon removal of the second multiple pole jumper plug.

2. The backplane of claim 1, wherein
   a) the contact means of the at least one socket connector on the first side of the backplane comprising bus contact pins extending to the second side of the backplane;
   b) a plurality of contact pins being disposed on the second side of the backplane, each contact pin being electrically connected with a line of one of the first bus and the second bus, and each contact pin being adjacent to a corresponding one of the bus contact pins of the at least one socket connector extending to the second side of the backplane;
   c) the at least one first multiple pole jumper plug being arranged on the second side of the backplane to controllably electrically connect at least a preselected one of the contact pins of the first bus to the corresponding one of the bus contact pins of the socket connector extending to the second side; and
   d) the at least one second multiple pole jumper plug being arranged on the second side of the backplane to controllably electrically connect at least a preselected one of the contact pins of the second bus to the corresponding one of the bus contact pins of the socket connector extending to the second side.

3. A method for identifying a defective module from among a plurality of modules in a computer system, comprising the steps of:
   providing a first bus having bus lines capable of coupling the plurality of modules to one another;
   providing a second bus having bus lines capable of coupling the plurality of modules to one another, the second bus being redundant of the first bus;
   providing a first set of multiple pole jumper plugs;
   using each one of the first set of multiple pole jumper plugs to controllably, removably electrically connect a respective one of the plurality of modules to the bus lines of the first bus;
   using the first bus to couple the plurality of modules to one another via the first set of multiple pole jumper plugs;
   in the event of a malfunction in the computer system, using the second, redundant bus to couple the plurality of modules to one another;
   thereafter, removing each one of the first set of multiple pole jumper plugs, one at a time, to electrically disconnect each one of the plurality of modules, respectively, from the first bus, one at a time, to identify a malfunctioning one of the modules.

4. The method of claim 3, comprising the further steps of:
   providing a second set of multiple pole jumper plugs;
   using each one of the second set of multiple pole jumper plugs to controllably, removably electrically connect a respective one of the plurality of modules to the bus lines of the second bus.

* * * * *